US00RE44407E

(19) United States
(12) Reissued Patent
Kister

(10) Patent Number: US RE44,407 E
(45) Date of Reissued Patent: Aug. 6, 2013

(54) SPACE TRANSFORMERS EMPLOYING WIRE BONDS FOR INTERCONNECTIONS WITH FINE PITCH CONTACTS

(75) Inventor: January Kister, Portola Valley, CA (US)

(73) Assignee: FormFactor, Inc., Livermore, CA (US)

(21) Appl. No.: 12/646,661

(22) Filed: Dec. 23, 2009

Related U.S. Patent Documents

Reissue of:
(64) Patent No.: 7,312,617
Issued: Dec. 25, 2007
Appl. No.: 11/385,289
Filed: Mar. 20, 2006

(51) Int. Cl.
*G01R 31/20* (2006.01)

(52) U.S. Cl.
USPC ..... 324/754.11; 324/762.03; 324/754.03; 324/756.03

(58) Field of Classification Search
USPC ..... 324/756.03, 762.05, 754.11, 762.03, 324/754.03
See application file for complete search history.

(56) References Cited

U.S. PATENT DOCUMENTS

| | | | |
|---|---|---|---|
| 3,518,612 | A | 6/1970 | Dunman et al. |
| 3,599,093 | A | 8/1971 | Oates |
| 3,710,251 | A | 1/1973 | Hagge et al. |
| 3,812,311 | A | 5/1974 | Kvaternik |
| 4,027,935 | A | 6/1977 | Byrnes et al. |
| 4,115,736 | A | 9/1978 | Tracy |
| 4,116,523 | A | 9/1978 | Coberly et al. |
| 4,423,376 | A | 12/1983 | Byrnes et al. |
| 4,525,697 | A | 6/1985 | Jones et al. |
| 4,532,423 | A | 7/1985 | Tojo et al. |
| 4,567,433 | A | 1/1986 | Ohkubo et al. |
| 4,593,961 | A | 6/1986 | Cosmo |
| 4,618,767 | A | 10/1986 | Smith et al. |
| 4,618,821 | A | 10/1986 | Lenz |
| 4,706,019 | A | 11/1987 | Richardson |
| 4,730,158 | A | 3/1988 | Kasai et al. |

(Continued)

FOREIGN PATENT DOCUMENTS

| | | |
|---|---|---|
| DE | 4237591 | 5/1994 |
| EP | 0144682 | 6/1985 |

(Continued)

OTHER PUBLICATIONS

Sporck, Nicholas, "A New Probe Card Technology Using Compliant Microsprings", *Proceedings 1997 IEEE International Test Conference* Nov. 1, 1997, 527-532.

(Continued)

*Primary Examiner* — Arleen M Vazquez
(74) *Attorney, Agent, or Firm* — Deborah A. Peacock; Peacock Myers, P.C.

(57) ABSTRACT

Method and apparatus for electrical testing of a device under test (DUT) that employs a connection board with signal contacts for applying test signals and a space transformer that has low pitch contacts arranged on one or more circumferential shelves that define an enclosure in the space transformer. The apparatus has a substrate with fine pitch contacts positioned such that these are within the enclosure. A set of wire bonds is used for pitch reduction by interconnecting the fine pitch contacts with the low pitch contacts arranged on the shelves. The probes are connected to the fine pitch contacts and are used to apply the test signals to a DUT by contacting its pads. In some embodiments, the fine pitch contacts may be embodied by plugs or by blind metal vias.

68 Claims, 4 Drawing Sheets

U.S. PATENT DOCUMENTS

| | | | | |
|---|---|---|---|---|
| 4,747,698 | A | 5/1988 | Wickramasinghe et al. | |
| 4,757,255 | A | 7/1988 | Margozzi | |
| 4,772,846 | A | 9/1988 | Reeds | |
| 4,773,877 | A | 9/1988 | Kruger et al. | |
| 4,807,159 | A | 2/1989 | Komatsu et al. | |
| 4,901,013 | A | 2/1990 | Benedetto et al. | |
| 4,967,148 | A | 10/1990 | Doemens et al. | |
| 4,973,903 | A | 11/1990 | Schemmel | |
| 5,015,947 | A | 5/1991 | Chism | |
| 5,026,291 | A | 6/1991 | David | |
| 5,030,318 | A | 7/1991 | Reche | |
| 5,061,192 | A | 10/1991 | Chapin et al. | |
| 5,067,007 | A | 11/1991 | Otsuka et al. | |
| 5,145,384 | A | 9/1992 | Asakawa et al. | |
| 5,205,739 | A | 4/1993 | Malo et al. | |
| 5,207,585 | A | 5/1993 | Byrnes | |
| 5,225,771 | A | 7/1993 | Leedy | |
| 5,230,632 | A | 7/1993 | Baumberger et al. | |
| 5,237,743 | A | 8/1993 | Busacco et al. | |
| 5,354,205 | A | 10/1994 | Feigenbaum et al. | |
| 5,399,982 | A | 3/1995 | Driller | |
| 5,422,574 | A | 6/1995 | Kister | |
| 5,430,614 | A | 7/1995 | Difrancesco | |
| 5,436,571 | A | 7/1995 | Karasawa | |
| 5,468,994 | A * | 11/1995 | Pendse | 257/693 |
| 5,476,211 | A | 12/1995 | Khandros | |
| 5,531,022 | A | 7/1996 | Beaman et al. | |
| 5,576,631 | A | 11/1996 | Stowers et al. | |
| 5,632,631 | A | 5/1997 | Fjelstad et al. | |
| 5,635,846 | A | 6/1997 | Beaman et al. | |
| 5,642,056 | A * | 6/1997 | Nakajima et al. | 324/750.22 |
| 5,644,249 | A | 7/1997 | Kister | |
| 5,676,599 | A | 10/1997 | Ricks et al. | |
| 5,701,085 | A * | 12/1997 | Malladi et al. | 324/750.09 |
| 5,720,098 | A | 2/1998 | Kister | |
| 5,742,174 | A | 4/1998 | Kister et al. | |
| 5,751,157 | A | 5/1998 | Kister | |
| 5,764,070 | A | 6/1998 | Pedder | |
| 5,764,072 | A | 6/1998 | Kister | |
| 5,764,409 | A | 6/1998 | Colvin | |
| 5,767,691 | A | 6/1998 | Verkuil | |
| 5,772,451 | A | 6/1998 | Dozier, II et al. | |
| 5,773,987 | A | 6/1998 | Montoya | |
| 5,802,699 | A | 9/1998 | Fjelstad et al. | |
| 5,806,181 | A | 9/1998 | Khandros et al. | |
| 5,821,763 | A | 10/1998 | Beaman et al. | |
| 5,829,128 | A | 11/1998 | Eldridge et al. | |
| 5,832,601 | A | 11/1998 | Eldridge et al. | |
| 5,847,936 | A * | 12/1998 | Forehand et al. | 361/794 |
| 5,852,871 | A | 12/1998 | Khandros | |
| 5,864,946 | A | 2/1999 | Eldridge et al. | |
| 5,884,395 | A | 3/1999 | Dabrowiecki et al. | |
| 5,892,539 | A | 4/1999 | Colvin | |
| 5,914,613 | A | 6/1999 | Gleason et al. | |
| 5,917,707 | A | 6/1999 | Khandros et al. | |
| 5,923,178 | A | 7/1999 | Higgins et al. | |
| 5,926,951 | A | 7/1999 | Khandros et al. | |
| 5,932,323 | A | 8/1999 | Throssel | |
| 5,934,914 | A | 8/1999 | Fjelstad et al. | |
| 5,936,421 | A | 8/1999 | Stowers et al. | |
| 5,945,836 | A | 8/1999 | Sayre et al. | |
| 5,952,843 | A | 9/1999 | Vinh | |
| 5,969,533 | A | 10/1999 | Takagi | |
| 5,970,167 | A | 10/1999 | Colvin | |
| 5,974,662 | A | 11/1999 | Eldridge et al. | |
| 5,994,152 | A | 11/1999 | Khandros et al. | |
| 6,027,630 | A | 2/2000 | Cohen | |
| 6,029,344 | A | 2/2000 | Khandros et al. | |
| 6,031,282 | A | 2/2000 | Jones et al. | |
| 6,064,215 | A | 5/2000 | Kister | |
| 6,066,957 | A | 5/2000 | Van Loan et al. | |
| 6,071,630 | A | 6/2000 | Tomaru et al. | |
| 6,086,386 | A | 7/2000 | Fjelstad et al. | |
| 6,133,072 | A | 10/2000 | Fjelstad | |
| 6,184,576 | B1 | 2/2001 | Jones et al. | |
| 6,204,674 | B1 | 3/2001 | Dabrowiecki et al. | |
| 6,205,660 | B1 | 3/2001 | Fjelstad et al. | |
| 6,215,320 | B1 | 4/2001 | Parrish | |
| 6,218,203 | B1 | 4/2001 | Khoury et al. | |
| 6,246,245 | B1 | 6/2001 | Akram et al. | |
| 6,246,247 | B1 | 6/2001 | Eldridge et al. | |
| 6,247,228 | B1 | 6/2001 | Distefano et al. | |
| 6,255,126 | B1 | 7/2001 | Mathieu et al. | |
| 6,259,261 | B1 | 7/2001 | Engelking et al. | |
| 6,278,284 | B1 | 8/2001 | Mori et al. | |
| 6,292,003 | B1 | 9/2001 | Fredrickson et al. | |
| 6,334,247 | B1 | 1/2002 | Beaman et al. | |
| 6,336,259 | B1 | 1/2002 | Eldridge et al. | |
| 6,344,753 | B1 | 2/2002 | Takada et al. | |
| 6,411,112 | B1 | 6/2002 | Das et al. | |
| 6,414,502 | B1 | 7/2002 | Sayre et al. | |
| 6,419,500 | B1 | 7/2002 | Kister | |
| 6,420,887 | B1 | 7/2002 | Kister et al. | |
| 6,424,164 | B1 | 7/2002 | Kister | |
| 6,433,571 | B1 | 8/2002 | Montoya | |
| 6,437,584 | B1 | 8/2002 | Gleason et al. | |
| 6,441,315 | B1 | 8/2002 | Eldridge et al. | |
| 6,443,784 | B1 | 9/2002 | Kimoto | |
| 6,482,013 | B2 | 11/2002 | Eldridge et al. | |
| 6,483,328 | B1 * | 11/2002 | Eldridge et al. | 324/754.18 |
| 6,486,689 | B1 | 11/2002 | Nishikawa | |
| 6,496,026 | B1 | 12/2002 | Long et al. | |
| 6,525,552 | B2 | 2/2003 | Kister | |
| 6,529,021 | B1 | 3/2003 | Yu et al. | |
| 6,530,148 | B1 | 3/2003 | Kister | |
| 6,538,336 | B1 * | 3/2003 | Secker et al. | 257/786 |
| 6,566,898 | B2 | 5/2003 | Theissen et al. | |
| 6,570,396 | B1 | 5/2003 | Kister | |
| 6,573,738 | B1 | 6/2003 | Matsuo et al. | |
| 6,575,767 | B2 | 6/2003 | Satoh et al. | |
| 6,576,485 | B2 | 6/2003 | Zhou et al. | |
| 6,586,955 | B2 | 7/2003 | Fjelstad et al. | |
| 6,615,485 | B2 | 9/2003 | Eldridge et al. | |
| 6,624,648 | B2 | 9/2003 | Eldridge et al. | |
| 6,633,176 | B2 | 10/2003 | Takemoto et al. | |
| 6,641,430 | B2 | 11/2003 | Zhou et al. | |
| 6,646,455 | B2 | 11/2003 | Maekawa et al. | |
| 6,676,438 | B2 | 1/2004 | Zhou et al. | |
| 6,677,245 | B2 | 1/2004 | Zhou et al. | |
| 6,690,185 | B1 * | 2/2004 | Khandros et al. | 324/756.03 |
| 6,707,311 | B2 | 3/2004 | Hohenwarter | |
| 6,727,719 | B2 | 4/2004 | Liao et al. | |
| 6,731,123 | B2 | 5/2004 | Kimoto | |
| 6,765,228 | B2 | 7/2004 | Lin et al. | |
| 6,768,331 | B2 | 7/2004 | Longson et al. | |
| 6,825,422 | B2 | 11/2004 | Eldridge et al. | |
| 6,842,023 | B2 | 1/2005 | Yoshida et al. | |
| 6,847,221 | B2 | 1/2005 | Kimoto et al. | |
| 6,853,208 | B2 | 2/2005 | Okubo et al. | |
| 6,881,974 | B2 | 4/2005 | Wood et al. | |
| 6,890,185 | B1 | 5/2005 | Kister et al. | |
| 6,897,666 | B2 | 5/2005 | Swettlen et al. | |
| D507,198 | S | 7/2005 | Kister | |
| 6,917,102 | B2 | 7/2005 | Zhou et al. | |
| 6,917,525 | B2 | 7/2005 | Mok et al. | |
| D510,043 | S | 9/2005 | Kister | |
| 6,945,827 | B2 | 9/2005 | Grube et al. | |
| 6,956,389 | B1 | 10/2005 | Mai | |
| 6,965,244 | B2 | 11/2005 | Miller | |
| 6,965,245 | B2 | 11/2005 | Kister et al. | |
| 6,970,005 | B2 | 11/2005 | Rincon et al. | |
| 7,015,707 | B2 | 3/2006 | Cherian | |
| 7,036,221 | B2 | 5/2006 | Higashida et al. | |
| 7,046,021 | B2 | 5/2006 | Kister | |
| 7,059,865 | B2 | 6/2006 | Kister et al. | |
| 7,064,564 | B2 | 6/2006 | Kister et al. | |
| 7,068,057 | B2 | 6/2006 | Tervo et al. | |
| D525,207 | S | 7/2006 | Kister et al. | |
| 7,071,715 | B2 | 7/2006 | Shinde et al. | |
| 7,073,254 | B2 | 7/2006 | Eldridge et al. | |
| 7,078,921 | B2 | 7/2006 | Haga et al. | |
| 7,088,118 | B2 * | 8/2006 | Liu et al. | 324/754 |
| 7,091,729 | B2 | 8/2006 | Kister | |
| 7,108,546 | B2 * | 9/2006 | Miller et al. | 439/578 |
| 7,109,731 | B2 | 9/2006 | Gleason et al. | |
| 7,143,500 | B2 | 12/2006 | Byrd | |
| 7,148,709 | B2 | 12/2006 | Kister | |

| | | | | |
|---|---|---|---|---|
| 7,150,658 | B1 | 12/2006 | Chien | |
| 7,173,441 | B2 | 2/2007 | Kister et al. | |
| 7,189,078 | B2 | 3/2007 | Kister et al. | |
| 7,202,682 | B2 | 4/2007 | Cooper et al. | |
| 7,217,138 | B2 | 5/2007 | Kister et al. | |
| 7,218,127 | B2 | 5/2007 | Cooper et al. | |
| 7,218,131 | B2 | 5/2007 | Tanioka et al. | |
| 7,225,538 | B2 | 6/2007 | Eldridge et al. | |
| 7,227,371 | B2 | 6/2007 | Miller | |
| 7,265,565 | B2 | 9/2007 | Chen et al. | |
| 7,274,195 | B2 | 9/2007 | Takemoto et al. | |
| 7,281,305 | B1 | 10/2007 | Iyer | |
| 7,285,966 | B2 | 10/2007 | Lee et al. | |
| 7,312,617 | B2 | 12/2007 | Kister | |
| 7,345,492 | B2 | 3/2008 | Kister | |
| 7,417,447 | B2 | 8/2008 | Kister | |
| 7,436,192 | B2 | 10/2008 | Kister | |
| 7,511,523 | B2 | 3/2009 | Chen et al. | |
| 7,514,948 | B2 | 4/2009 | Kister | |
| 7,649,367 | B2 | 1/2010 | Kister | |
| 7,659,739 | B2 | 2/2010 | Kister | |
| 7,671,610 | B2 | 3/2010 | Kister | |
| 7,733,101 | B2 | 6/2010 | Kister | |
| 7,759,949 | B2 | 7/2010 | Kister | |
| 7,786,740 | B2 | 8/2010 | Kister | |
| 8,230,593 | B2 | 7/2012 | Kister | |
| 2001/0012739 | A1 | 8/2001 | Grube et al. | |
| 2001/0040460 | A1 | 11/2001 | Beaman et al. | |
| 2002/0070743 | A1 | 6/2002 | Felici et al. | |
| 2002/0125584 | A1 | 9/2002 | Umehara et al. | |
| 2002/0153913 | A1 | 10/2002 | Okubo et al. | |
| 2002/0190738 | A1* | 12/2002 | Beaman et al. | 324/754 |
| 2002/0194730 | A1 | 12/2002 | Shih et al. | |
| 2003/0027423 | A1 | 2/2003 | Zhou et al. | |
| 2003/0116346 | A1 | 6/2003 | Forster et al. | |
| 2004/0036493 | A1 | 2/2004 | Miller | |
| 2004/0046579 | A1* | 3/2004 | Chraft et al. | 324/754 |
| 2004/0104737 | A1 | 6/2004 | Haga et al. | |
| 2004/0119485 | A1 | 6/2004 | Koch et al. | |
| 2004/0239352 | A1 | 12/2004 | Mizoguchi | |
| 2005/0012513 | A1 | 1/2005 | Cheng et al. | |
| 2005/0179458 | A1 | 8/2005 | Chen et al. | |
| 2005/0184743 | A1* | 8/2005 | Kimura | 324/754 |
| 2005/0189955 | A1 | 9/2005 | Takemoto et al. | |
| 2006/0033516 | A1 | 2/2006 | Rincon et al. | |
| 2006/0040417 | A1* | 2/2006 | Eldridge et al. | 438/14 |
| 2006/0073712 | A1 | 4/2006 | Suhir | |
| 2006/0082380 | A1 | 4/2006 | Tanioka et al. | |
| 2006/0170440 | A1 | 8/2006 | Sudin | |
| 2006/0171425 | A1 | 8/2006 | Lee et al. | |
| 2006/0186905 | A1 | 8/2006 | Kohashi et al. | |
| 2006/0208752 | A1 | 9/2006 | Tanioka et al. | |
| 2006/0261828 | A1 | 11/2006 | Cram et al. | |
| 2007/0145989 | A1* | 6/2007 | Zhu et al. | 324/754 |
| 2007/0167022 | A1 | 7/2007 | Tsai et al. | |
| 2007/0229100 | A1* | 10/2007 | Miller | 324/754 |
| 2008/0074132 | A1 | 3/2008 | Fan et al. | |
| 2009/0201041 | A1 | 8/2009 | Kister | |
| 2010/0109691 | A1 | 5/2010 | Kister | |
| 2010/0176832 | A1 | 7/2010 | Kister | |
| 2010/0182030 | A1 | 7/2010 | Kister | |
| 2010/0182031 | A1 | 7/2010 | Kister | |
| 2010/0289512 | A1 | 11/2010 | Kister | |
| 2011/0006796 | A1 | 1/2011 | Kister | |
| 2011/0062978 | A1 | 3/2011 | Kister | |
| 2011/0273198 | A1 | 11/2011 | Kister | |
| 2011/0273199 | A1 | 11/2011 | Kister | |

FOREIGN PATENT DOCUMENTS

| | | |
|---|---|---|
| EP | 0764352 | 5/2004 |
| JP | 63-307678 | 12/1988 |
| JP | 01128535 | 5/1989 |
| JP | 7-021968 | 1/1995 |
| JP | 7-333232 | 12/1995 |
| JP | 10-506238 | 6/1998 |
| JP | 10-221374 | 8/1998 |
| JP | 11241690 | 8/1999 |
| WO | WO 8704568 | 7/1987 |
| WO | WO 92/10010 | 6/1992 |
| WO | WO 96/15458 | 5/1996 |
| WO | WO 96/37332 | 11/1996 |
| WO | WO 09743653 | 11/1997 |
| WO | WO 01/09623 | 2/2001 |

OTHER PUBLICATIONS

Levy, Larry, "Water Probe TM System", *Southwest Workshop* formfactor inc. Jun. 1997, 1-19.

* cited by examiner

SPACE TRANSFORMERS EMPLOYING WIRE BONDS FOR INTERCONNECTIONS WITH FINE PITCH CONTACTS

Matter enclosed in heavy brackets [ ] appears in the original patent but forms no part of this reissue specification; matter printed in italics indicates the additions made by reissue.

FIELD OF THE INVENTION

This invention relates generally to apparatus and method using wire bonds for making electrical connections between low pitch signal contacts and fine pitch contacts to probes used for applying test signals to a device under test.

BACKGROUND ART

The testing of semiconductor wafers and other types of integrated circuits (ICs), collectively known as devices under test (DUTs), needs to keep pace with technological advances. Each IC has to be individually tested, typically before dicing, in order to ensure that it is functioning properly. The demand for testing products is driven by considerations of new chip designs and higher volumes.

In particular, chips are getting smaller and they have more tightly spaced contact pads. The pads are no longer located about the circuit perimeter, but in some designs may be found within the area occupied by the circuit itself. As a result, the spacing or pitch of probe arrays required to establish electrical contact with the pads or bumps is decreasing. In addition, the requirements on planarity are increasing.

To address the increasingly fine pitch of the pads, several prior art solutions have resorted to using more effective space transformers for achieving pitch reduction and improved probe performance. Several examples of recent space transformers for probe contact assemblies are found in the patent literature, including U.S. Pat. Nos. 6,676,438 and 6,917,102 to Zhou et al. These teachings include several contact structures and production methods, including an embodiment using the flip-chip bonding process to attach the space transformer. Still other prior art, such as U.S. application Ser. No. 2006/0033516 to Rincon et al. teaches a probe and universal tester contact assemblage that is capable of testing multiple chips. This assemblage employs a wire bond between the end of a trace that is connected to a probe and a fan-out trace that belongs to an intermediate element or interposer made of a dielectric material to step up from low pitch contacts to fine pitch contacts.

In addition to the finer pitch of the pads to be tested, there has also been a move to increase the test signal frequencies. Some prior art probe devices address the coupling and noise problems arising at such higher frequencies. For example, U.S. Pat. No. 6,714,034 discusses the inclusion of an inductive (magnetic) filter to suppress AC noise on the DUT ground and U.S. application Ser. No. 2005/0012513 to Cheng et al. teaches a probe card assembly with a stiffener ring and a set of coaxial transmitters. Furthermore, U.S. application Ser. No. 2005/0099191 talks about the design of a multi-GHz probe structure for optimizing the signal path to improve bandwidth. Unfortunately, this probe structure can only address a limited number of pads and is thus only suitable for devices with a small number of pads located along the die perimeter. Devices that have a large number of fine pitch pads located along the perimeter or arranged in an array cannot be tested with such probe structure.

Clearly, as more complicated arrays of pads having a fine pitch are to be tested at high frequencies the prior art space transformers and high-frequency handling can not be integrated to produce suitable solutions. In particular, the high-frequency performance of typical wired space transformers that employ via holes and copper wires that use heads equipped with buckling beam or similar probes is insufficient. Even though probe cards employing such space transformers can be made cheaply and relatively quickly, they experience unacceptably high levels of electrical cross-talk and self-inductance with an upper bound on test frequency of about 0.9 GHz at a 3 dB bandwidth. Furthermore, such probe cards can only be made with up to about 1,500 connections, since the wiring process becomes too cumbersome at higher connection counts.

Some probe cards avoid the use of wires and employ instead a space transformer made of an organic substrate (e.g., MLC or MLD) with solder reflow connections to a connection board (typically a printed circuit board to which the test signals are applied). Such probe cards exhibit much improved high frequency performance, typically up to 3 GHz at a 3 dB bandwidth, but are hard to make and require expensive lithographic processing.

Employing wire bonding techniques and wire bonds is in general a very low-cost and mature method of making electrical connections and is used in various related contexts including interposers, probes and space transformers. For example, U.S. application Ser. No. 2002/0125584 discusses using wire bonding to ensure high bond strength between the bonding pads and conducting wires when wire-bonding chips to carriers. Specifically, the weak bonding strength problem is solved by designating a separate section of the IC pad for probing and a separate section for wire-bonding. U.S. application Ser. No. 2002/0194730 teaches how to repair probes mounted on a space transformer that were shaped and made using wire-bonding. U.S. application Ser. No. 2003/0116346 shows how to use a wire-bonding machine to make stud-bumped probes.

Although the prior art solutions individually address some of the problems associated with pitch step up and reliable connections, there is no apparatus or method that combines the requisite characteristics in a single space transformer that can be used in a probe card or testing apparatus. Specifically, what is needed is a space transformer that is compatible with high frequency test signals, easy to make, low cost and can address densely packed pads or bumps arranged in arrays.

OBJECTS AND ADVANTAGES

In view of the above prior art limitations, it is an object of the invention to provide a low-cost method and apparatus for electrically testing devices under test (DUTs) that have densely spaced arrays of contact pads or bumps. More precisely, the object is to provide such apparatus with a space transformer that takes advantage of low-cost wire bonding for interconnections with the fine pitch contacts.

It is another object of the invention, to ensure that the space transformer is capable of handling high-frequency test signals.

It is still another object of the invention to ensure that the method and apparatus can be easily integrated with any conventional head designs to take advantage of any available probe geometry.

These and other objects and advantages of the invention will become apparent from the ensuing description.

SUMMARY OF THE INVENTION

The objects and advantages of the invention are secured by a method and an apparatus for electrical testing of a device under test (DUT). The apparatus has a connection board that has signal contacts for applying test signals and a space transformer with intermediate contacts connected to the signal contacts. The space transformer has low pitch contacts that are connected to the intermediate contacts. The low pitch contacts are arranged on one or more circumferential shelves that define an enclosure. A substrate with fine pitch contacts is positioned such that the fine pitch contacts are within the enclosure. A set of wire bonds is used for pitch reduction by interconnecting the fine pitch contacts with the low pitch contacts on the shelves by any suitable wire bonding or wedge bonding including ribbon bonding for power/ground technique. The probes are connected to the fine pitch contacts and are used to apply the test signals to a DUT by contacting its pads.

In a preferred embodiment, the fine pitch contacts are made of contact plugs that are lodged or secured by epoxy in corresponding vias made in the substrate. The vias can be etched or laser machined, depending on the material of which the substrate is made. The plugs are preferably mico-electro machined, i.e., they are MEMs plugs. The substrate itself, can be made of any suitable material including ceramics, organics such as MLC or MLD, or, preferably $Al_2O_3$.

The space transformer has a lower circumferential shelf bearing a lower set of low pitch contacts and at least one upper circumferential shelf bearing an upper set of the low pitch contacts. In accordance with the invention, the one or more upper circumferential shelves are recessed or inset from the lower circumferential shelf. The lower set of low pitch contact arranged on the lower shelf usually includes a ground contact.

The wire bonds are made between the lower set of low pitch contacts and the fine pitch contacts and also between the upper set of low pitch contacts and the fine pitch contacts. In particular, the wire bonds include a short set of wire bonds interconnecting a set of the fine pitch contacts proximal the lower shelf with the lower set of low pitch contacts arranged on the lower shelf. Since this set contains the shortest wire bonds it is preferable that the ground contact be included in this set, as mentioned above. The wire bonds further include a long set of wire bonds interconnecting a set of the fine pitch contacts remote from the lower shelf with the upper set of low pitch contacts arranged on the one or more upper shelves. It is preferable for high-frequency operation that the longest wire bonds in the long set of wire bonds be at most a few millimeters in length.

In the fully assembled space transformer according to the invention, the enclosure is preferably filled with a dielectric material. This is done after all the wire bonds have been made in order to ensure stability and insulation.

The step down or pitch reduction from the intermediate contacts to the fine pitch contacts is preferably about ten to one. In numerical terms the intermediate contacts are at a pitch of about 1 mm and the fine pitch contacts are at a pitch of about 0.1 mm or 100 μm.

The apparatus of the invention is preferably employed in a probe card for testing a DUT by delivering the test signals to the pads of the DUT when the pads are contacted by the probes. The DUT is typically an integrated circuit.

The method of invention for electrically testing the DUT includes the steps of providing the connection board with signal contacts and providing the space transformer. The space transformer has intermediate contacts and low pitch contacts connected to the intermediate contacts. The low pitch contacts are arranged on one or more circumferential shelves that define the enclosure, and the signal contacts are connected to the intermediate contacts. Furthermore, a substrate with fine pitch contacts is provided and positioned such that the fine pitch contacts are within the enclosure. The fine pitch contacts are interconnected with the low pitch contacts by a set of wire bonds and the probes are connected to the fine pitch contacts. Then, the test signals are applied to the signal contacts and the probes are contacted with the pads of the DUT for performing the electrical test.

Preferably, the fine pitch contacts are made by producing vias in the substrate and lodging contact plugs in the vias. The vias can be laser machined and the plugs can be made by a micro-electro machining technique. The space transformer has a lower circumferential shelf bearing a lower set of low pitch contacts and one or more upper circumferential shelves bearing an upper set of low pitch contacts. The one or more upper circumferential shelves are recessed or inset from the lower circumferential shelf, and a set of fine pitch contacts proximal the lower shelf is interconnected with the lower set of low pitch contacts by a short set of wire bonds. A set of fine pitch contacts remote from the lower shelf is interconnected with the upper set of the low pitch contacts by a long set of wire bonds. After the interconnections are made, the enclosure is filled with the dielectric material.

A detailed description of the preferred embodiments of the invention is presented below in reference to the appended drawing figures.

BRIEF DESCRIPTION OF THE DRAWING FIGURES

DETAILED DESCRIPTION

Figure 1:
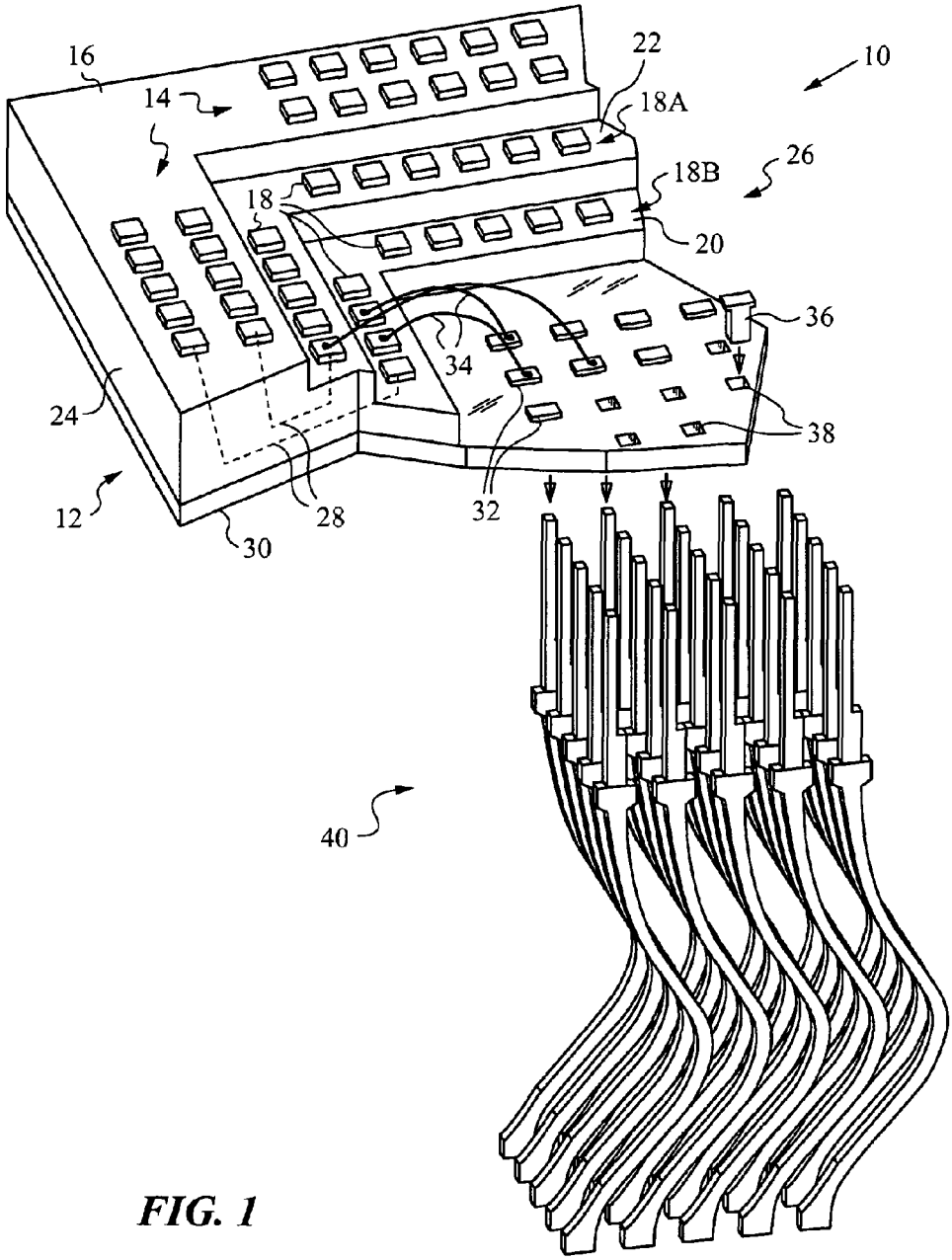
FIG. 1 is a partial three-dimensional diagram illustrating an apparatus of the invention.

The present invention will be best understood by first reviewing an apparatus 10 of the invention as shown in a partial three-dimensional diagram of FIG. 1. Apparatus 10 has a space transformer 12 with intermediate contacts 14 located on a ledge 16. Space transformer also has low pitch contacts 18 that are arranged on a lower circumferential shelf 20 and an upper circumferential shelf 22. Specifically, a lower set 18A of low pitch contacts 18 is located on lower circumferential shelf 20 and an upper set 18B of low pitch contacts 18 is located on upper circumferential shelf 22. Furthermore, upper shelf 22 is recessed or inset from lower shelf 20 to enable easy access by wire bonding equipment to low pitch contacts 18 on both shelves.

Ledge 16 and shelves 20, 22 extend circumferentially (only partially shown in FIG. 1) to define a structure 24 that has an internal enclosure 26. Any suitable, mechanically stable dielectric material or materials can be used to construct structure 24 that includes ledge 16 and shelves 20, 22. For example, structure 24 can be made layer-by-layer, thus defining lower shelf 20 first, then upper shelf 22 and finally ledge 16. During the formation of the structure, embedded electrical connections 28 are made to connect intermediate contacts 14 with corresponding low pitch contacts 18.

Space transformer 12 has a substrate 30 with a number of fine pitch contacts 32. Substrate 30 is positioned below structure 24 such that fine pitch contacts 32 are within enclosure 26. Substrate 30 can be permanently attached to structure 24 by any suitable bonding method. It should be noted that in some embodiments it is useful when structure 24 is removable. For example, this is of value when substrate 30 is a mini printed circuit board and the contacts 32 are blind metal vias.

A set of wire bonds 34 is used for pitch reduction by interconnecting fine pitch contacts 32 with low pitch contacts 18 on shelves 20, 22. Wire bonding is a technique well known in the art and typically involves one of the following three major techniques: thermocompression bonding, ultrasonic bonding, and thermosonic bonding. In general, ultrasonic bonding will be preferred for Aluminum wire bonding, and thermosonic bonding will be preferred for Au wire bonding. In order to accrue the full benefit of the invention including low electric cross-talk and low self-inductance, the maximum length of any particular wire bond 34 should not exceed a few millimeters and preferably be at most 5 millimeters. The specific techniques for bonding to low pitch contacts 18 include wire bonding or wedge bonding, including ribbon bonding used for power/ground technique.

In the preferred embodiment, fine pitch contacts 32 are made of contact plugs 36 that are lodged or secured by epoxide in corresponding vias 38 in substrate 30. Vias 38 can be etched or laser machined, depending on the material of which substrate 30 is made. For example, substrate 30 can be made of a ceramic or an organic such as MLC or MLD in which case the "plugs" equivalent would be electroplated vias. In this case there would be no need for MEMS plugs and epoxide. Preferably, however, substrate 30 is made of $Al_2O_3$ so that it lends itself well to laser machining, which is the preferred technique due to its high accuracy and speed. Plugs 36 are preferably mico-electro machined, i.e., they are MEMs plugs made of a nickel and cobalt alloy plated with gold. In an alternative embodiment, vias 38 are filled with metal and thus themselves constitute fine pitch contacts 32. In other words, vias 38 are blind metal vias and serve as fine pitch contacts 32.

A number of probes 40 are connected to fine pitch contacts 32. Specifically, probes 40 are connected to the bottoms of plugs 36 or blind metal vias 38, depending on the embodiment. Although in the embodiment shown, probes 40 are non-linear, it will be appreciated by one skilled in the art that they can be of any variety, including buckling beam probes. Moreover, probes 40 can be held together in any suitable mechanical retention device or be otherwise configured in a suitable head unit. Such head unit can be removable or permanently attached to space transformer 12, depending on application.

Figure 2:
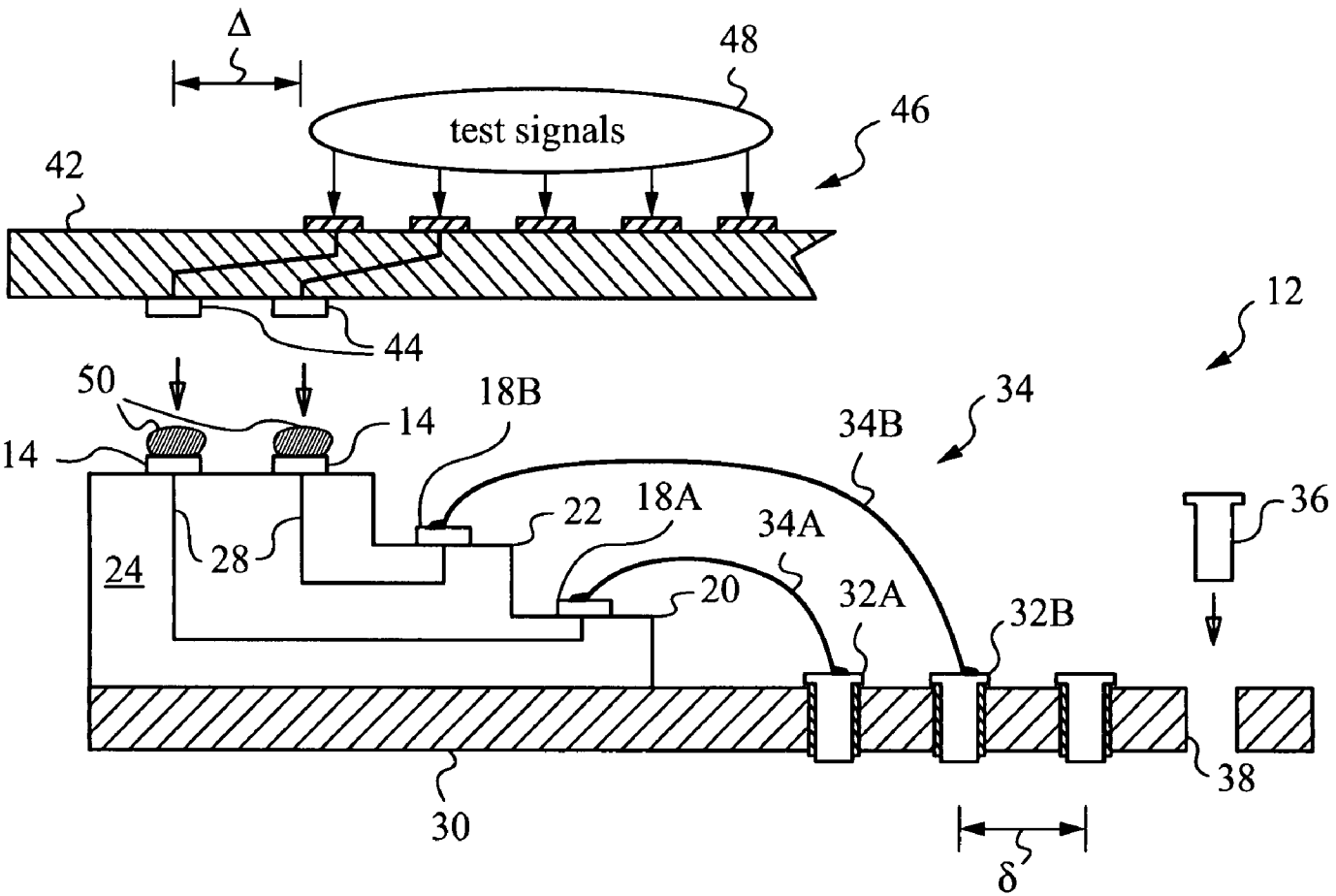
FIG. 2 is cross-sectional side view of a portion of the apparatus of FIG. 1.

Referring now to the partial cross-sectional side view of FIG. 2 for more detail, we see that apparatus 10 also has a connection board 42 with signal contacts 44. Typically, connection board 42 is a printed circuit board (PCB) with appropriate primary contacts 46 for applying test signals 48. Primary contacts 46 are electrically connected to corresponding signal contacts 44 for delivering test signals 48. Test signals 48 are usually generated by a testing circuit (not shown) and applied to primary contacts 46 with the aid of spring pins or other suitable mechanism.

Intermediate contacts 14 of space transformer 12 are connected to signal contacts 44. In the present embodiment, this is accomplished with solder reflow junctions 50. Thus, primary contacts 46 are in electrical communication with corresponding low pitch contacts 18 on shelves 20, 22. More specifically, lower set of low pitch contacts 18A arranged on lower circumferential shelf 20 and upper set of low pitch contacts 18B arranged on upper circumferential shelf 22 are in electrical communication with primary contacts 46 via signal contacts 44, intermediate contacts 14 and embedded electrical connections 28. Therefore, test signals 48 can be delivered directly to the appropriate low pitch contacts 18 of space transformer 12.

Wire bonds 34 between lower set of low pitch contacts 18A and fine pitch contacts 32 and also between the upper set of low pitch contacts 18B and fine pitch contacts 32 are made in accordance with a certain scheme. In particular, wire bonds 34 include a short set of wire bonds 34A interconnecting a set of fine pitch contacts 32A proximal lower shelf 20 with lower set of low pitch contacts 18A arranged on lower shelf 20. Since this set contains the shortest wire bonds it is preferable that the ground contact be included in this set.

Wire bonds 34 further include a long set of wire bonds 34B interconnecting a set of the fine pitch contacts 32B remote from lower shelf 20 with upper set of low pitch contacts 18B arranged on upper shelf 22. It is preferable for high-frequency operation that the longest wire bonds in long set of wire bonds 32B be at most 5 millimeters in length. This is done in order to reduce cross-talk between wire bonds 34 and self-inductance to permit the application of high frequency test signals 48, e.g., test signals in the range of several GHz.

In FIG. 2, reference $\Delta$ denotes the pitch of intermediate contacts 14 and reference $\delta$ denotes the pitch of fine pitch contacts 32. In accordance with the invention, the step down or pitch reduction from pitch $\Delta$ of intermediate contacts 14 to pitch $\delta$ of fine pitch contacts 32 is preferably about ten to one. In numerical terms $\Delta$ is on the order of about 1 mm and $\delta$ is on the order of about 0.1 mm or 100 μm. For peripheral IC pad test application the pitch is as small as 35 μm today. For full grid array flip-chip bump test the minimum pitch is about 140 μm today.

Figure 3:
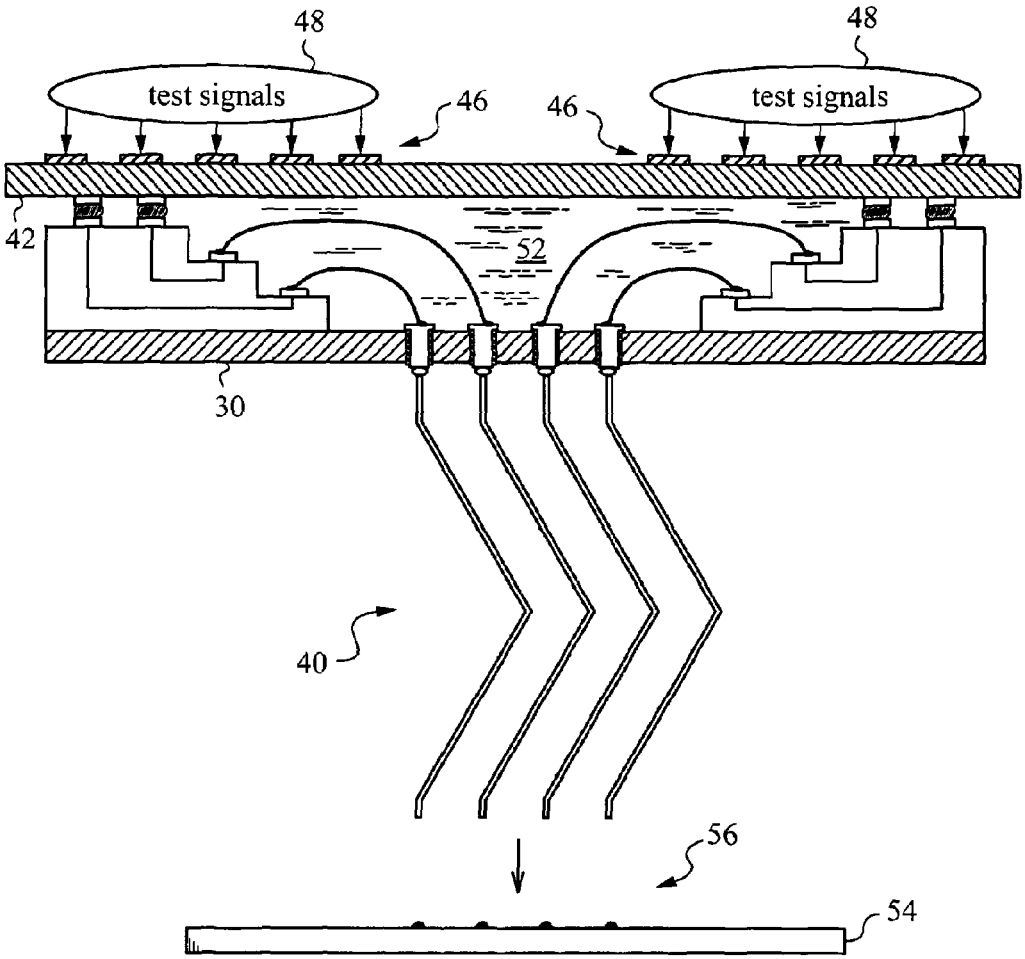
FIG. 3 is a side cross-sectional view of an assembled apparatus according to the invention.

FIG. 3 is a cross-sectional side view of a fully assembled apparatus 10. In this fully assembled state, space transformer 12 has its enclosure 26 filled with a dielectric material 52. This is done after all wire bonds 34 have been made in order to ensure stability and insulation. Of course, the wires used in bonds 34 can be already insulated, e.g., with a non-conductive ink or by other means, thus making the presence of material 52 unnecessary. However, non-insulated wires can also be used, and in this case material 52 must be used to avoid shorts. Material 52 also provides mechanical stability to space transformer 12 and apparatus 10 as a whole. This is especially important, to sustain the aggregate forces acting on probes 40 and apparatus 10 during normal operation due to the deflection of probes 40. Such forces can be quite large—for example, with 2000 probes 40 each exerting 10 grams of force the total force pushing on the assembly of apparatus 10 is about 20 kg. It should be noted that at the present time, as many as 5,000 probes 40 can be used in one apparatus 10.

Apparatus 10 is used for electrical testing of a device under test (DUT) 54. DUT 54 has a number of pads or bumps 56, which have to be contacted by probes 40 to apply test signals 48 thereto and thus conduct the test. Apparatus 10 is preferably employed in a probe card for testing integrated circuits with high-frequency test signals 48. For example, DUT 54 is an integrated circuit on a wafer that requires testing prior to dicing. Alternatively, DUT 54 is an electronic device or circuit that is already mounted and whose functionality needs to be verified by applying test signals 48 to a number of its bumps or pads 56.

Figure 4:
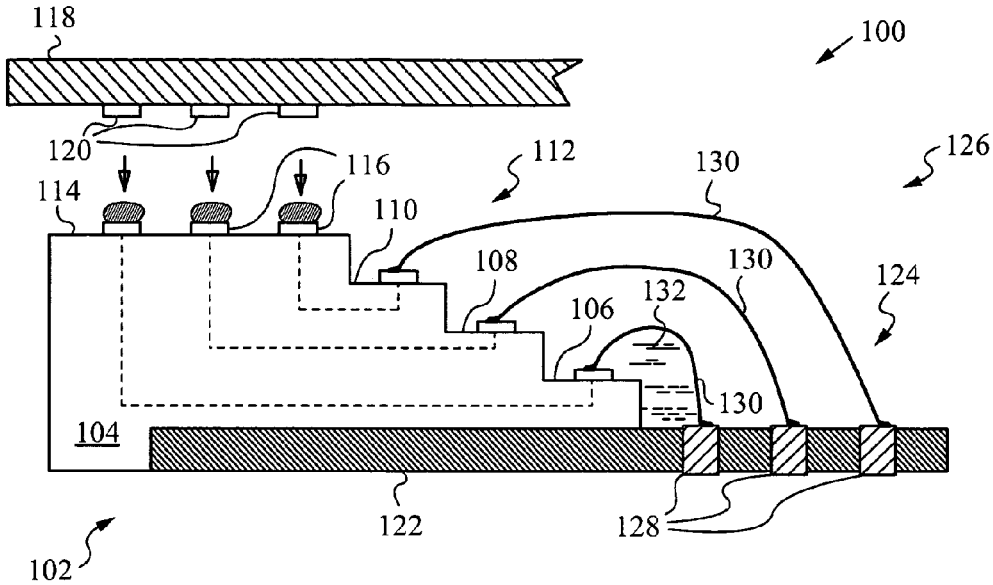
FIG. 4 is a cross-sectional side view of a portion of another apparatus according to the invention.

FIG. 4 is a cross-sectional side view of a portion of an apparatus 100 according to the invention. Apparatus 100 employs a space transformer 102 with a structure 104 that has three circumferential shelves 106, 108, 110 bearing low pitch contacts 112. A ledge 114 of structure 104 bears connection intermediate contacts 116 that are connected to corresponding low pitch contacts 112. A connection board 118 with signal contacts 120 that are reflow soldered to intermediate contacts 116 is used to deliver test signals to low pitch contacts 112.

Space transformer 102 employs a mini printed circuit board 122 as a substrate. Board 122 is attached to structure 104 as shown and positioned such that its set of fine pitch contacts 124 is contained within an enclosure 126 defined by shelves 106, 108, 110. Board 122 has a set of blind metal vias 128 that serve as fine pitch contacts. A set of wire bonds 130 interconnects fine pitch contacts 124 or the tops of blind vias 128 with low pitch contacts 112. As before, any suitable wire bonding technique can be employed to accomplish this connection. In this embodiment, the probes (not shown) are attached to the bottoms of vias 128.

As in the previous embodiment, it is preferable to keep the lengths of wire bonds 130 as short as possible, and most preferably under 5 mm. This limitation places the toughest restrictions on wire bonds 130 interconnecting low pitch contacts 112 from top shelf 110 and vias 128 that are remote from bottom shelf 106. In addition, in this embodiment it is essential to use insulated wire for wire bonds 130 to further counteract any possibility of shorts.

As before, a dielectric material 132 is used for potting wire bonds 130. Preferably, the potting is performed sequentially by first interconnecting and potting the shortest wire bonds 130 between lowest shelf 106 and vias 128 closest to structure 104. Then repeating the process for the second shelf 108 wire bonds and finally for third shelf 110 wire bonds.

Figure 5:
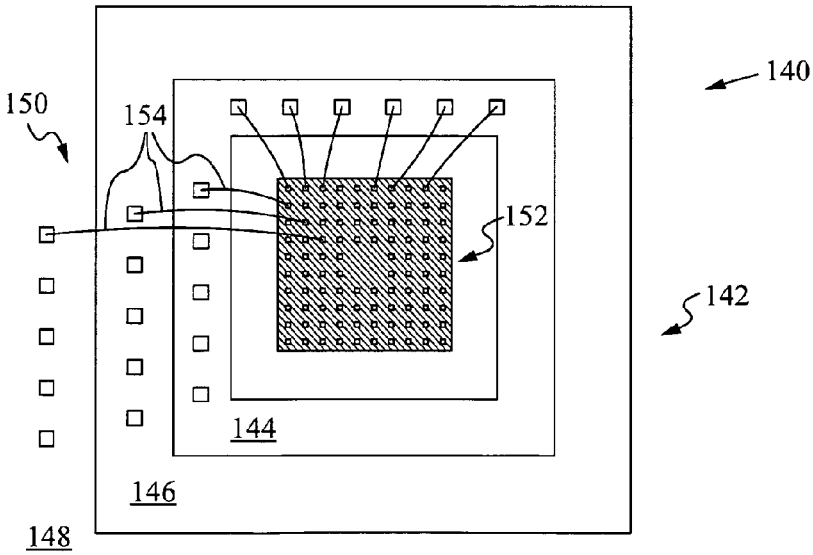
FIG. 5 is a top plan view illustrating interconnections in a space transformer according to the invention.

In any of the above embodiments, or in still other embodiments, it is important to optimize the localization of low pitch contacts and fine pitch contacts. One approach involves staggering of contacts, as shown in the top plan view of FIG. 5. In this example a space transformer 140 has a structure 142 with three circumferential shelves 144, 146, 148. Low pitch contacts 150 are staggered with respect to each other and with respect to fine pitch contacts 152. Thus, interconnections performed with wire bonds 154 are non-overlapping because the wires from different shelves 144, 146, 148 tend to fall in-between each other. It should be noted that appropriate potting can be employed in this embodiment to further aid in accommodating more shelves and making more secure overarching wire bonds 154.

A person skilled in the art will recognize that the above are merely a few exemplary embodiments and that many other embodiments of the apparatus and method are possible. Therefore, the scope of the invention should be judged by the appended claims and their legal equivalents.

I claim:

1. An apparatus for electrical testing, comprising:

a) a connection board having signal contacts for applying test signals;

b) a space transformer having intermediate contacts connected to said signal contacts, said space transformer further having low pitch contacts connected to said intermediate contacts and arranged on at least one circumferential shelf, said at least one circumferential shelf defining an enclosure;

c) a substrate having fine pitch contacts and positioned such that said fine pitch contacts are within said enclosure;

d) a set of wire bonds interconnecting said fine pitch contacts with said low pitch contacts;

e) probes connected to said fine pitch contacts.

2. The apparatus of claim 1, wherein said fine pitch contacts comprise contact plugs lodged in corresponding vias in said substrate.

3. The apparatus of claim 2, wherein said vias are laser machined and said plugs are made by a micro-electro machining technique.

4. The apparatus of claim 2, wherein said substrate comprises a material selected from the group consisting of ceramics, organics and $Al_2O_3$.

5. The apparatus of claim 1, wherein said fine pitch contacts comprise blind metal vias.

6. The apparatus of claim 1, wherein said space transformer comprises a lower circumferential shelf bearing a lower set of said low pitch contacts and at least one upper circumferential shelf bearing an upper set of said low pitch contacts, said at least one upper circumferential shelf being inset from said lower circumferential shelf.

7. The apparatus of claim 6, wherein said lower set of said low pitch contacts comprises a ground contact.

8. The apparatus of claim 6, wherein said set of wire bonds comprises a short set of wire bonds interconnecting a set of said fine pitch contacts proximal said lower shelf with said lower set of said low pitch contacts.

9. The apparatus of claim 6, wherein said set of wire bonds comprises a long set of wire bonds interconnecting a set of said fine pitch contacts remote said lower shelf with said upper set of said low pitch contacts.

10. The apparatus of claim 9, wherein said long set of wire bonds comprises wire bonds of at most 5 millimeters in length.

11. The apparatus of claim 1, wherein said enclosure is filled with a dielectric material.

12. The apparatus of claim 1, wherein a pitch reduction from said intermediate contacts to said fine pitch contacts is about ten to one.

13. The apparatus of claim 1, employed in a probe card for testing a device under test by delivering said test signals to pads of said device under test by contacting said pads with said probes.

14. The apparatus of claim 13, wherein said device under test comprises an integrated circuit.

15. A method for electrically testing a device under test, said method comprising:

a) providing a connection board having signal contacts;

b) providing a space transformer having intermediate contacts and low pitch contacts connected to said intermediate contacts, said low pitch contacts being arranged on at least one circumferential shelf, said at least one circumferential shelf defining an enclosure;

c) connecting said signal contacts to said intermediate contacts;

d) providing a substrate having fine pitch contacts and positioned such that said fine pitch contacts are within said enclosure;

e) interconnecting said fine pitch contacts with said low pitch contacts by a set of wire bonds;

f) connecting probes to said fine pitch contacts;

g) applying test signals to said signal contacts; and h) contacting said probes with pads of said device under test for electrically testing said device under test.

16. The method of claim 15, wherein said fine pitch contacts are made by producing vias in said substrate and lodging contact plugs in said vias.

17. The method of claim 16, wherein said vias are laser machined and said plugs are made by a micro-electro machining technique.

18. The method of claim 15, wherein said space transformer comprises a lower circumferential shelf bearing a lower set of said low pitch contacts and at least one upper circumferential shelf bearing an upper set of said low pitch contacts, said at least one upper circumferential shelf being inset from said lower circumferential shelf, and wherein said method further comprises interconnecting a set of said fine pitch contacts proximal said lower shelf with said lower set of said low pitch contacts by a short set of wire bonds, and interconnecting a set of said fine pitch contacts remote said lower shelf with said upper set of said low pitch contacts by a long set of wire bonds.

19. The method of claim 15, further comprising filling said enclosure with a dielectric material.

*20. An apparatus for electrical testing comprising:*

*a layered space transformer;*

*a first layer of said layered space transformer comprising a substrate;*

*said substrate comprising a plurality of fine pitch contacts;*

*a second layer of said layered space transformer comprising a structure disposed around an outside circumference of said substrate;*

*said structure comprising at least one shelf, said shelf comprising a plurality of low pitch contacts;*

*said structure further comprising a ledge disposed above said shelf;*

*said ledge comprising a plurality of intermediate contacts;*

*said intermediate contacts electrically connected to corresponding said low pitch contacts via electrical connections embedded within said structure; and*

*a plurality of bonds interconnecting said fine pitch contacts with corresponding said low pitch contacts.*

*21. The apparatus of claim 20 further comprising an enclosure defined by said shelf.*

*22. The apparatus of claim 21 wherein said fine pitch contact is within said enclosure.*

*23. The apparatus of claim 21 further comprising a dielectric material filling the enclosure.*

*24. The apparatus of claim 20 comprising a pitch reduction from said intermediate contact to said fine pitch contact of about ten to one.*

*25. The apparatus of claim 20 further comprising at least one signal contact and wherein said signal contact is connected to said intermediate contact.*

*26. The apparatus of claim 25 wherein said connection between said signal contact and said intermediate contact comprises a solder reflow junction.*

*27. The apparatus of claim 25 further comprising a connection board connected to said signal contact.*

*28. The apparatus of claim 27 wherein said connection board comprises a printed circuit board.*

*29. The apparatus of claim 27 wherein said connection board comprises a primary contact connected to said signal contact.*

*30. The apparatus of claim 27 further comprising a probe connected to said fine pitch contact.*

*31. The apparatus of claim 20 wherein said shelf comprises a circumferential shelf.*

*32. The apparatus of claim 20 comprising an upper shelf and a lower shelf.*

*33. The apparatus of claim 32 comprising a lower set of low pitch contacts located on said lower shelf and an upper set of low pitch contacts located on said upper shelf.*

*34. The apparatus of claim 33 comprising a short set of wire bonds interconnecting a set of said fine pitch contacts proximal to said lower shelf with said lower set of low pitch contacts.*

*35. The apparatus of claim 33 wherein said lower set of low pitch contacts comprises a ground contact.*

*36. The apparatus of claim 33 comprising a long set of wire bonds interconnecting a set of said fine pitch contacts remote to said lower shelf with said upper set of said low pitch contacts.*

*37. The apparatus of claim 32 wherein said upper shelf is recessed from said lower shelf.*

*38. The apparatus of claim 32 wherein said shelves are made layer-by-layer.*

*39. The apparatus of claim 20 wherein said substrate is positioned below said shelf.*

*40. The apparatus of claim 39 wherein said substrate is permanently attached to said shelf.*

*41. The apparatus of claim 39 wherein said substrate is removably attached to said shelf.*

*42. The apparatus of claim 20 wherein said substrate comprises a circuit board.*

*43. The apparatus of claim 20 wherein said fine pitch contact comprises a via.*

*44. The apparatus of claim 43 wherein said via comprises a blind via.*

*45. The apparatus of claim 44 wherein said blind via comprises a blind metal via.*

*46. The apparatus of claim 20 wherein said wire bond is equal to or less than 5 millimeters.*

*47. The apparatus of claim 20 wherein said at least one fine pitch contact comprising a contact plug.*

*48. The apparatus of claim 47 further comprising a via, wherein said contact plug is secured in said substrate by said via.*

*49. The apparatus of claim 47 wherein said plug is microelectro machined.*

*50. The apparatus of claim 20 wherein said substrate comprises aluminum oxide.*

*51. The apparatus of claim 20 wherein said substrate comprises ceramic.*

*52. The apparatus of claim 20 wherein said substrate comprises organics.*

*53. The apparatus of claim 20 wherein said wire bond comprises a short wire bond for bonding.*

*54. The apparatus of claim 20 wherein said apparatus is employed in a probe card.*

*55. The apparatus of claim 20 comprising three shelves.*

*56. The apparatus of claim 20 comprising a plurality of low pitch contacts staggered with respect to a plurality of fine pitch contacts.*

*57. The apparatus of claim 20 wherein said bond comprises a wire bond.*

*58. A method for testing a device under test comprising:*

*providing a layered space transformer comprising a first layer of the layered space transformer having a substrate, a second layer of the layered space transformer having a structure disposed around an outside circumference of the substrate, the structure comprising at least one shelf, the shelf comprising a plurality of low pitch contacts, the structure further comprising a ledge disposed above the shelf, the ledge comprising a plurality of intermediate contacts;*

*disposing a plurality of fine pitch contacts on the substrate;*

*interconnecting the low pitch contacts to corresponding intermediate contacts via electrical connections embedded within the structure;*

*interconnecting the fine pitch contacts with corresponding low pitch contacts by at least one wire bond; and*

*applying a high frequency test signal to a device under test.*

*59. The method of claim 58 further comprising connecting the intermediate contact to a signal contact located on a connection board.*

*60. The method of claim 59 further comprising applying a test signal to the signal contact.*

*61. The method of claim 58 further comprising connecting at least one probe to the fine pitch contact.*

*62. The method of claim 61 further comprising contacting the probe with a pad of the device under test for electrically testing the device under test.*

*63. The method of claim 58 wherein said fine pitch contact comprises producing a via in said substrate and lodging a contact plug in the via.*

*64. The method of claim 63 further comprising laser-machining the via.*

*65. The method of claim 63 further comprising micro-electro machining the plug.*

*66. The method of claim 58 wherein the space transformer comprises a lower shelf bearing a lower set of low pitch contacts and at least one upper shelf bearing an upper set of the low pitch contacts.*

*67. The method of claim 66 further comprising interconnecting a set of fine pitch contacts proximal to the lower shelf with the lower set of low pitch contacts by a short set of wire bonds.*

*68. The method of claim 66 further comprising interconnecting a set of fine pitch contacts remote to the lower shelf with the upper set of low pitch contacts by a long set of wire bonds.*

* * * * *